United States Patent [19]
Bezama et al.

[11] Patent Number: 5,707,480
[45] Date of Patent: Jan. 13, 1998

[54] APPARATUS FOR FORMING MULTIPLE CAVITY PRODUCTS

[75] Inventors: Raschid Jose Bezama, Mahopac; John Ulrich Knickerbocker, Hopewell Junction; Govindarajan Natarajan, Pleasant Valley; Joseph Gang Zhou, Brooklyn, all of N.Y.

[73] Assignee: International Business Machines Corporation, Armonk, N.Y.

[21] Appl. No.: 530,500

[22] Filed: Sep. 19, 1995

[51] Int. Cl.⁶ .............................. B32B 31/04; B32B 31/20
[52] U.S. Cl. .................. 156/382; 156/89; 156/285; 156/580
[58] Field of Search .................. 156/89, 228, 285, 156/381, 382, 583.1, 580

[56] References Cited

U.S. PATENT DOCUMENTS

| | | | |
|---|---|---|---|
| 4,024,629 | 5/1977 | Lemoine et al. | 29/625 |
| 4,636,275 | 1/1987 | Norell | 156/289 |
| 4,680,075 | 7/1987 | McNeal et al. | 156/289 |
| 4,734,155 | 3/1988 | Tsunoda et al. | 156/583.1 |
| 4,753,694 | 6/1988 | Herron et al. | 156/89 |
| 4,824,509 | 4/1989 | Tonoki et al. | 156/285 |
| 4,854,994 | 8/1989 | Breiter et al. | 156/228 |
| 4,946,640 | 8/1990 | Nathoo | 264/316 |
| 5,108,532 | 4/1992 | Thein et al. | 156/285 |
| 5,217,563 | 6/1993 | Niebling et al. | 156/382 |
| 5,478,420 | 12/1995 | Gauci et al. | 156/89 |
| 5,538,582 | 7/1996 | Natarajan et al. | 156/285 |

OTHER PUBLICATIONS

Phillips, "Fixture for Fabricating Complex Substrate Design From Green Sheet Ceramics", IBM Technical Disclosure Bulletin, vol. 16, No. 11, p. 3559 (Apr. 1974).

*Primary Examiner*—James Sells
*Attorney, Agent, or Firm*—Aziz M. Ahsan

[57] ABSTRACT

The present invention relates generally to a new apparatus and method for simultaneously laminating a plurality of substrates having at least one cavity. More particularly, the invention encompasses apparatus and method for fabricating cavities in MLC (multi-layer ceramic). A membrane with or without an opening is placed on the top surface of the unlaminated green sheet having at least one cavity and then standard pressure is applied to laminate the green sheets, while simultaneously a counter pressure is applied in the cavity to prevent the cavity from deforming or collapsing. This is done to simultaneously form a plurality of cavity substrates.

24 Claims, 2 Drawing Sheets

APPARATUS FOR FORMING MULTIPLE CAVITY PRODUCTS

CROSS-REFERENCE TO RELATED PATENT APPLICATION

This patent application is related to U.S. patent application Ser. No. 08/530,499, entitled "METHOD FOR FORMING MULTIPLE CAVITY PRODUCTS", which was filed on Sep. 19, 1995, and the disclosure of which is incorporated herein by reference.

FIELD OF THE INVENTION

The present invention relates generally to a new apparatus and method for simultaneously laminating a plurality of substrates having at least one cavity. More particularly, the invention encompasses apparatus and method for fabricating cavities in MLC (multi-layer ceramic).

A membrane with or without an opening is placed on the top surface of the unlaminated green sheet having at least one cavity and then standard pressure is applied to laminate the green sheets, while simultaneously a counter pressure is applied in the cavity to prevent the cavity from deforming or collapsing. This is done to simultaneously form a plurality of cavity substrates.

BACKGROUND OF THE INVENTION

Semiconductor substrates and devices are becoming smaller and more dense with the evolution of new technologies. However, increases in circuit density produces a corresponding increase in overall manufacturing problems. These manufacturing problems must however be kept to a minimum in order for the semiconductor manufacturer to remain competitive. The semiconductor manufacturers are therefore constantly being challenged to improve the quality of their products by identifying and eliminating defects which produce defective parts or components. Whereas significant improvements are being made to eliminate systematic defects by reducing process variability. Process improvements alone are not sufficient to eliminate all the random defects which effect both yield and reliability. Historically, screening techniques have been employed to improve product failure rates to acceptable levels by culling out many of these random defects.

In their desire to improve their products the semiconductor manufacturers are constantly finding new ways and new techniques to improve or provide new products. It has been found that for some applications one could make a ceramic carrier or substrate having a cavity and then have the semiconductor chip placed inside the cavity and secured to the semiconductor substrate. These semiconductor substrates are often referred to as modules. These modules could be made from a single ceramic layer or green sheet forming a single layer ceramic module or a plurality of ceramic layers forming a MLC (multilayer ceramic) module.

These MLC modules having single or multiple cavities are normally used in the electronic industry to package high performance integrated circuits or chips. These high performance integrated circuits chips have large number of external input/output points, such as, pads, solder balls, to name a few, and these chips have a very high power dissipation. In order to accommodate such high performance chips the MLC substrate or module also have to provide high number of external input/output points, such as, pads, pins, to name a few, and also be able to handle the very high power dissipation that is being generated both from the module as well as the chip.

The single or multiple cavities in a MLC module are normally formed during the lamination process using typically a hard or a soft insert as a plug. This plug in turn prevents the collapse or deformation of the stacked green ceramic body or sheet during lamination. This method of producing single or multiple cavities requires machining of the inserts with high precision and with high level of surface finish.

Inherently, the cost of such inserts or plugs is very high. Additionally, these inserts or plugs do not provide the flexibility of using the same inserts for cavities of various shapes and sizes. Furthermore, placing these inserts and then subsequently removing them is an expensive process and many times this could lead to the delamination of the ceramic green sheets. Another drawback with these solid inserts is the need to clean them prior to every use to avoid the paste pull-outs or damage to the green ceramic layers.

Another method of producing these single or multiple cavities in the MLC module would be to machine the cavities after the green sheets have been laminated, but this would not be a cost effective way of producing parts in a high volume manufacturing operation.

It is also possible to form cavities in the MLC module with no inserts. This could be done for cases where the lamination conditions are such that there is no resulting deformation in green ceramic sheet or body. In these cases, typically, the lamination pressures are very low and the green sheet formulation is such that the dimensional control of products is achieved by altering the sintering process. However, in high volume manufacturing operation, tailoring the green sheet formulation and developing a sinter cycle for every product would be cost prohibitive and time consuming. Besides, this approach typically needs an adhesive between layers and multiple lamination steps to achieve the end result. Thus, some of the problems associated with this low pressure lamination process are that no process window for dimensional control is available for the sintered body. Delamination of the ceramic layer could happen in sintering due to the removal of the adhesive and the density gradients in the starting structure that are normally present could result in poor substrate dimensional control. Furthermore, there could be substantial increase in stacking and lamination cost and limitation in metal loading on the green sheets to have effective green sheet bonding.

In order to better understand the related art, the art could be broadly grouped into three general categories. The first being the art that is directed to shaping of an object by material deformation. The second being the art that deals with formation of non-planar and non-deformable objects by using cavity fills. While, the third art group could be one that deals with planar objects.

The following references could be classified under the first group which deals with deformation and shaping of a planar object.

U.S. Pat. No. 4,946,640 (Nathoo) shows that the deformation of the material could be accomplished by using a mold of desired contours. In this patent air is used as the lubricant and release agent to separate the preformed material from the mold.

U.S. Pat. No. 5,108,532 (Thein) shows that the deformation of a planar object could be accomplished by applying air on one side and vacuum on the other side.

The following references could be generally classified under the second group which deals with non-planar and non-deformable objects. However, this art group could be further divided into two unique sub-groups, where the first sub-group would be dealing with a non-planar lamination using solid insert, and the second sub-group would be dealing with a non-planar and non-deforming lamination with no inserts.

The following references could be classified in this first sub-group of non-planar lamination using solid insert.

U.S. Pat. No. 4,024,629 (Lemoine) shows that fugitive paste could be used as a cavity fill to prevent deformation during lamination.

U.S. Pat. No. 4,680,075 (McNeal) shows that a thermoplastic plug could be used to fit snugly inside a cavity as a cavity fill.

IBM Technical Disclosure Bulletin, Phillips, Vol. 16, No. 11, Pages 3559 (April 1974) shows that a metal insert could be used to fill a cavity.

The following references could be classified in the second sub-group of non-planar and non-deforming lamination with no inserts.

Both, U.S. Pat. No. 4,636,275 (Norell) and U.S. Pat. No. 4,824,509 (Tonoki) teach how to laminate a non-planar object with a non-deforming cavity by using a bag/bladder/elastomer separating the liquid applying the force from the object to be laminated.

Finally, following is a reference that could be classified in the third group that deals with planar objects.

U.S. Pat. No. 4,734,155 (Tsunoda) teaches the use of a mechanical device to apply pressure to the lamination plates.

All cavity lamination methods described above can also be further classified into three general groups depending on the manner in which they interact with the body being laminated. The first group could be the use of solid inserts to fabricate cavities that are planar with the laminating surface since the inserts themselves need to conform to the laminating surface.

The second group could be the use of a fluid and membrane to laminate the multilayer ceramic assembly that does not have to conform to any surface since the fluid applying the pressure distributes the force uniformly over the cavity surface.

The third group could include the use of fugitive paste which does conform to the laminating surface wherever there is no fugitive paste; but it does not need to conform to the laminating surface within the cavity region since the paste can have low viscosity relative to the viscosity of the multilayer ceramic body during the lamination process.

One of the problems that arises when fabricating cavities using one of the first group methods is the removal of the solid object or insert that was used to prevent the cavity collapse prior to the sintering process. Removal of a solid object from an unsintered ceramic body can cause layer separation or other mechanical damages to the unfired ceramic. Also, since the solid plug or insert used does not compress itself during the lamination process as the unfired ceramic body does, it is possible to create damage to the metallurgy or the ceramic module prior to sintering.

The use of a liquid and a membrane to laminate a cavity as expected from the methods described in the second group can eliminate most of the mechanical problems experienced with the first group methods; however, there are other new problems associated with the use of the second group method. The first being that it is possible to rupture the membrane and get the fluid to contaminate the multilayer ceramic assembly. And, the second is that it is difficult to maintain planarity on the cavity surface when the metal distribution within the package is not uniform prior to the lamination stage.

The present invention however solves all of the above mentioned problems by providing a cavity formation method at lamination that maintains planarity to the laminating surface during the laminating process while simultaneously preventing the cavity from collapsing.

The present invention primarily deals with the formation of cavities in a plurality of multi-layer ceramic (MLC) modules or substrates.

Basically, this invention allows the lamination of a plurality of non-planar objects in a multi-high configuration without any cavity deformation, which is achieved by mechanically applying force to the object to be laminated and by simultaneously applying pressure to the cavity volume using high pressure fluid, such as gas, to balance the deformation forces generated by the mechanically applied forces.

PURPOSES AND SUMMARY OF THE INVENTION

The invention is a novel method and apparatus for forming cavities without using an insert.

Therefore, one purpose of this invention is to provide an apparatus and a method that will form cavities without using an insert.

Another purpose of this invention is to provide an apparatus and a method that will form cavities in a multi-layer ceramic without using an insert.

Still another purpose of this invention is to have an apparatus and a method for forming cavities in a multi-layer ceramic substrate that is very economical.

Yet another purpose of this invention is to provide an apparatus and a method for forming cavities in a multi-layer ceramic substrate that is predictable and repeatable.

Still another purpose of this invention is to form cavities in several products simultaneously, but with a single lamination process cycle.

Yet another purpose of this invention is to provide a flexible apparatus and a method for forming cavities using isostatic or uniaxial lamination process.

Therefore, in one aspect this invention comprises a method of laminating a plurality of ceramic substrates having at least one cavity, comprising the steps of:

(a) placing at least one ceramic layer having at least one cavity over a first plate, (b) placing at least one cavity forming membrane over at least a portion of said at least one cavity forming membrane and said at least one cavity, (c) placing a porous plate having at least one opening over at least a portion of said at least one cavity, (d) putting pressure on at least a portion of said porous plate so that said first and porous plates come closer and simultaneously pressurizing through said at least one cavity forming membrane said at least one cavity in said ceramic layer with at least one gas to counter the pressure from said porous plate, thereby laminating said substrate with at least one cavity.

In another aspect this invention comprises a method of laminating a plurality of ceramic substrates having cavities, comprising the steps of:

(a) placing at least one ceramic layer having at least one cavity over a first plate, (b) placing at least one cavity forming membrane having at least one opening over at least a portion of said at least one cavity, such that at least a portion of said opening in said membrane is over at least a portion of said cavity, (c) placing a porous plate having at least one opening over at least a portion of said at least one opening in said membrane, (d) putting pressure on at least a portion of said porous plate so that said first and porous plate come closer, and simultaneously pressurizing through said at least one cavity forming membrane said at least one cavity in said ceramic layer with at least one gas to counter the pressure from said porous plate, thereby laminating said plurality of substrates with at least one cavity.

In yet another aspect this invention comprises an apparatus for forming cavities in at least one ceramic layer comprising, a first plate to accommodate said at least one ceramic layer having at least one cavity, at least one cavity forming membrane over at least a portion of said at least one cavity in said at least one ceramic layer, at least one internal pressure means over said at least one membrane, a porous plate having at least one opening over at least a portion of said at least one internal pressure means, and at least one external pressure application means over said porous plate, whereupon the application of said external pressure said internal pressure means in cooperation with said at least one membrane counters said external pressure and thereby forms said at least one ceramic layer having at least on cavity.

In still yet another aspect this invention comprises an apparatus for forming cavities in at least one ceramic layer comprising, a first plate to accommodate said at least one ceramic layer having at least one cavity, at least one cavity forming membrane having at least one opening over at least a portion of said at least one cavity in said at least one ceramic layer, such that at least a portion of said at least one opening is over at least a portion of said cavity, at least one internal pressure means over said at least one membrane, a porous plate having at least one opening over said internal pressure means and at least a portion of said at least one membrane, such that at least a portion of said at least one opening is over at least a portion of said opening in said membrane, and at least one external pressure application means over said porous plate, whereupon the application of said at least one external pressure said internal pressure means in cooperation with said at least one membrane counters said external pressure and thereby forms said at least one ceramic layer having at least on cavity.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
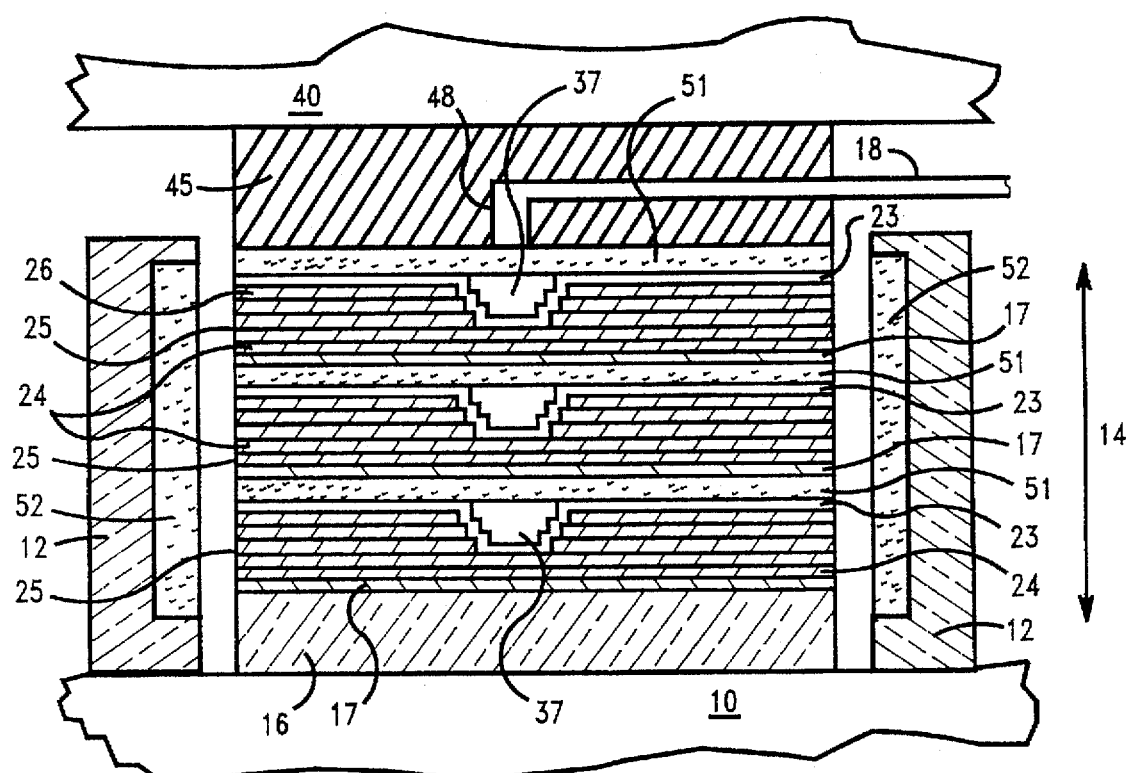
FIG. 1, illustrates the preferred embodiment of laminating a plurality of multi-layer ceramics having cavities using the inventive process of this invention.

FIG. 1, illustrates a preferred embodiment of laminating a plurality of multi-layer ceramics (MLC) having cavities using the inventive process of this invention. Individual ceramic tiles or layers 24, are used to build the MLC substrate or module 25. These ceramic layers 24, are typically fabricated using a tape casting process, which is well known in the art. First, large rolls or sheets of ceramic layers are produced, then individual layers or tiles 24, are punched out of these large rolls or sheets of ceramic layers. Subsequently, individual ceramic layers 26, that will form a cavity 27, are also blanked or a hole is punched appropriately to form the ceramic layers 26, with cavities 27. Typically, the material for the ceramic layer is selected from a group comprising alumina, alumina with glass frits, aluminum nitride, borosilicate and glass ceramic, to name a few.

Wiring metallurgy, which is also well known in the art, is then applied through standard process onto one or more surfaces of the individual ceramic layers 24, and blanked ceramic layers 26, or the ceramic layer with holes 26.

Figure 2:
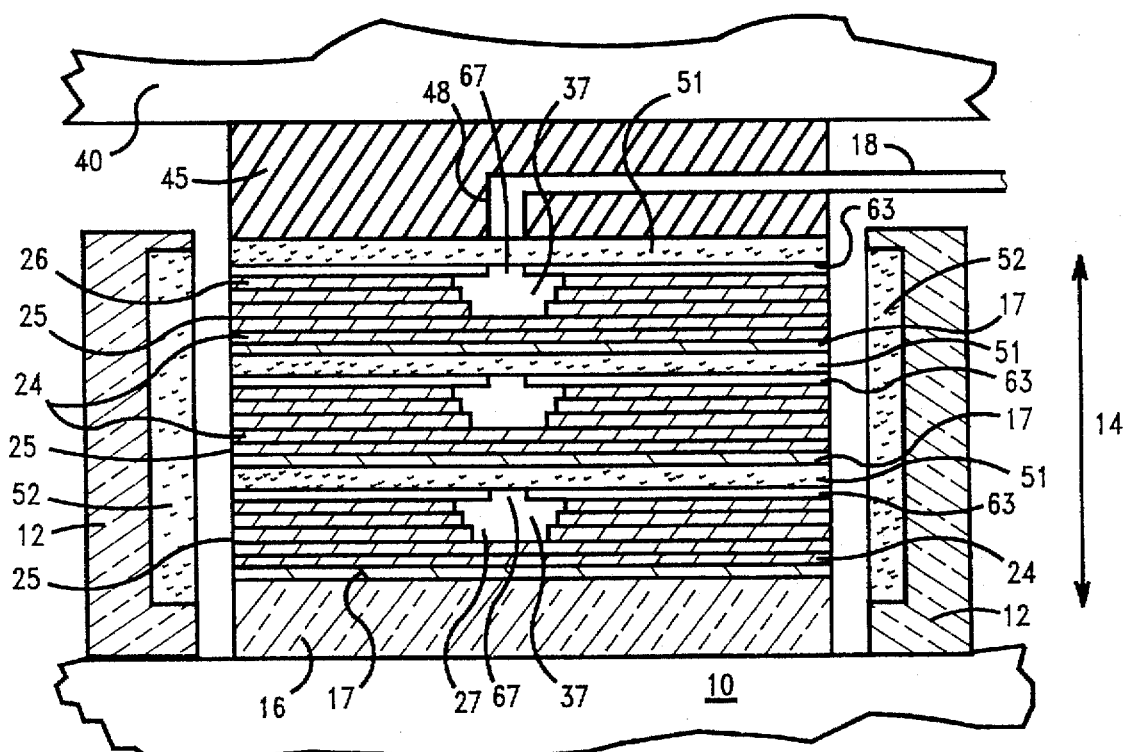
FIG. 2, illustrates another embodiment of laminating a plurality of multi-layer ceramics with cavities using the inventive process of this invention.
Figure 3:
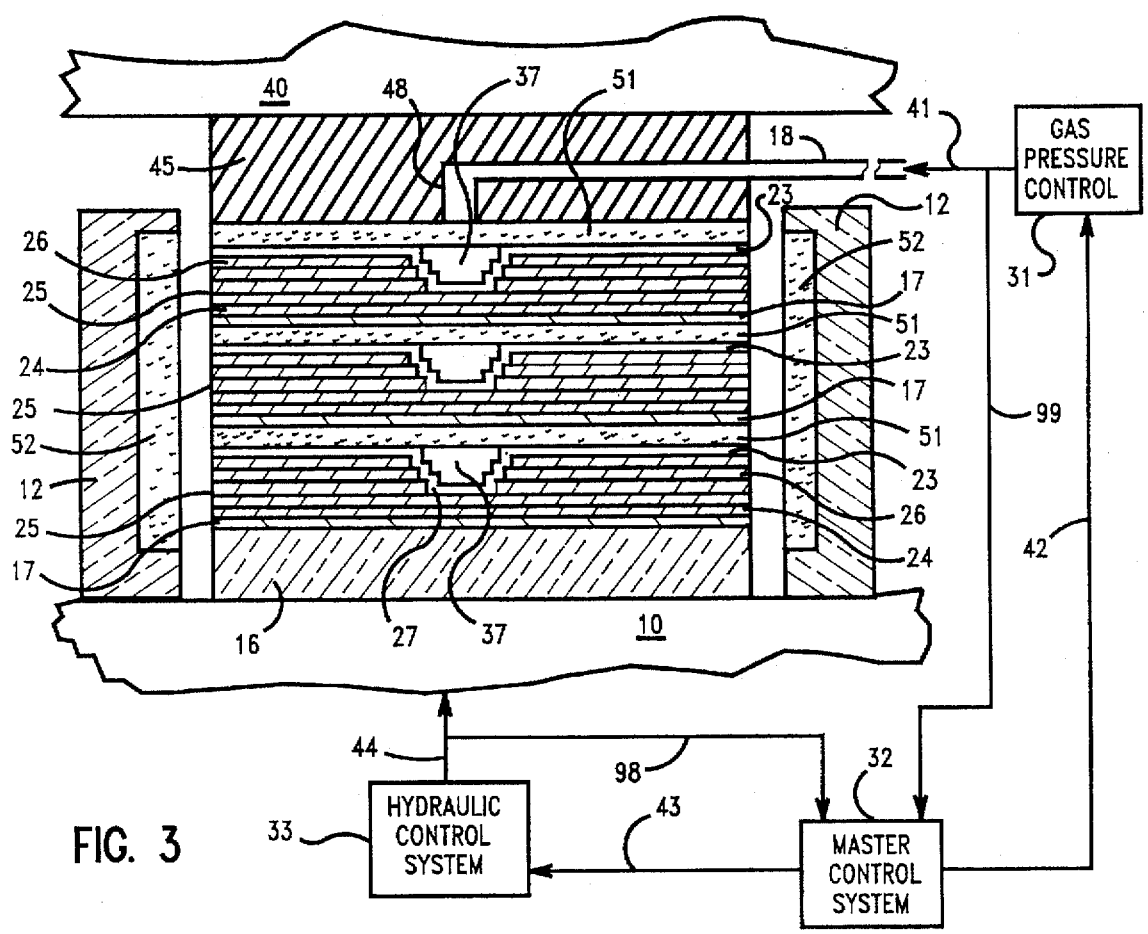
FIG. 3, illustrates one step in preventing deformation of cavities in a multi-layer ceramic using the inventive process of this invention.

A first flat or lamination plate 16, is then placed on top of a lamination platen 10. A frame 12, with porous side wall 52, is placed next to the first flat plate 16, such that the frame 12, holding the porous side-wall 52, can freely slide as shown by the arrow 14. The frame 12, is primarily there to properly align the ceramic layers 24 and 26, forming the multilayer ceramic module or substrate 25. As shown in FIGS. 1, 2 and 3, the individual ceramic layers 24, are first stacked inside the frame 12, and over the first flat plate 16. It is also preferred that a non-sticking sheet of material 17, that does not stick either to the surface of the first flat solid plate 16, or to the bottom surface of the ceramic layer 24, is placed between the upper surface of the first solid flat plate 16, and the first ceramic sheet 24. This non-sticking material 17, will further ensure that under pressure the first ceramic sheet 24, does not adhere or stick to the surface of the first flat plate 16. Additionally, ceramic sheets 24, are then placed over the first ceramic sheet 24, and then the blanked ceramic layers 26, are placed appropriately forming the cavity 27.

A cavity forming sheet or membrane 23, is then placed over the MLC module 25, in such a way that the surface of the top most ceramic sheets 26, is more or less covered with the membrane 23. Also, as shown in FIG. 1, which is one variation of the invention, the membrane 23, conformally covers the top or upper most ceramic sheet 26, and the cavity 27, and forms a membrane cavity 37. The membrane 23, is preferably composed of a flexible material, however the membrane could be a preform to conformally and/or loosely fit the cavity 27. A porous plate 51, with open pore structure is then placed over the cavity forming membrane 23. The stack structure that was described so far from the non-sticking material 17 through porous plate 51 may be built one over the other depending on the number of ceramic laminates that are desired to be laminated per individual lamination step as shown in FIG. 3. The next process step will be discussed later with reference to FIG. 3.

FIG. 2, illustrates another embodiment of making cavities in a multi-layer ceramics using the inventive process of this invention. The basic process and apparatus for this embodiment of the invention is the same as discussed with reference to FIG. 1, except that the cavity forming sheet or membrane 63, has an opening or hole 67. A portion of this hole 67, must be above a portion of the cavity 27, so that fluid from the porous plate 51, could enter and exit out of the cavity 27. As one can see that in this embodiment the membrane 63, does not conform to the profile of the cavity 27, and acts more like a flat plate that has an opening 67. Of course it would be obvious for a person skilled in the art to combine the membrane 23, and the membrane 67, such that opening 67, opens into the cavity 37.

As illustrated in FIG. 3, lamination plate 51, which is porous is now placed over the membrane 23 or 63. For multiple membrane cavities 37, the porous plate 51, will be used to provide the fluid coming from the fluid line 18, through an opening 48, in a fluid line fixture 45. Similarly, for multiple ceramic cavities 27, the porous plate 51, will be over the opening 67, in the membrane 63, that will be used to provide the fluid coming from the fluid line 18, through the opening 48, into the fixture 45. The fixture 45, has one or more openings 48, to bring the fluid into the cavities 27 or 37.

The lamination platen 10, is normally connected to a hydraulic control system 33, via a line 44. The lamination platen 10, could be secured to the frame 12, as well as the flat plate 16. Gas pressure control 31, provides input to the fluid line 18, via line 41, as well as to the master control system 32, through a line 42. Feedback line 99, connects the fluid or gas pressure control 31, to the master control system 32. Master control system 32, and the hydraulic control system 33, are connected via a line 43 with 98 as the feed back line.

After the apparatus of FIGS. 1, 2 and 3, have been set-up, external pressure is applied to the ceramic layers 24 and 26, through the flat plate 16, the porous plate 51, fixture 45, and pressure device 40. In order to prevent the cavity 27 or 37, from collapsing under this external pressure a counter internal pressure is applied inside the cavity 27 or 37, using a fluid, such as gas. This counter internal pressure inside the cavity 27 or 37, should be almost equal to the mechanical pressure being applied to the ceramic sheets 24 and 26, otherwise the cavity 27 or 37, will collapse if the external pressure is too high or unsuccessful lamination will result if internal pressure is too high. Multiple laminates with multiple cavities are processed simultaneously due to the internal gas pressure distribution through the porous plates 51 and porous side wall 52. This setup also helps to achieve isostatic lamination in a uniaxial press. After the individual ceramic layers 24 and 26, have been laminated to form the ceramic module or substrate 25, the apparatus is disassembled by removing the mechanical pressure device 40, the fixture 45, the porous plate 51, and the frame 12. The non-sticking membrane 23 or 63, is then gently peeled-off from the upper surface of the module 25. The module 25, could either be peeled-off from the non-sticky material 17, or the module 25, could be lifted from the first plate 16, and the non-sticky material or layer 17, could then be gently peeled-off from the module 25.

As stated earlier that the lamination apparatus required to laminate the multilayer ceramic module or substrate 25, basically consists of a frame 12, to hold the ceramic substrate 25, the flat plate 16 and the porous plate 51, used to apply the laminating pressure, and a fixture 45, used to deliver high gas pressure to the location in the unlaminated ceramic module 25, where a cavity 27, has to be formed. The internal gas pressure coming from the fluid line 18, into the cavity should not exceed the external pressure applied by the pressure device 10 and pressure device 40. As stated earlier the pressure devices 10 and 40, transmit the pressure to the modules 25, via the plate 16, and pressure fixture 45. The ceramic substrate 25, typically exhibits some level of rigidity under normal lamination conditions, and therefore care should be taken when applying both the internal and the external pressure. In practice, for the materials currently used to build ceramic modules 25, it is possible to maintain a pressure differential of less than 700 psi without observing deformation of the cavity.

Another embodiment of this invention, could comprise assembling the non-sticky material 17, the ceramic material 24 and 26, the cavity forming membrane 23 or 63, and the other related materials inside the frame 12, and the whole apparatus including the ceramic material 24 and 26, could be preheated to provide another way to form the laminated ceramic module 25. This preheating is typically done under low lamination pressure. The low lamination pressure ensures that the cavity 27 and/or cavity 37, do not collapse under the applied external or internal pressure. Low pressure is normally used at this stage only to accelerate the preheating step and to provide a better thermal contact between the flat plate 16 and porous plate 51, and the multilayer ceramic assembly 25.

Once the preheating stage has been completed the lamination process begins by increasing the pressure from the lamination platens 10 and/or 40, to the desired maximum lamination pressure. Simultaneously, as the external pressure from the lamination platens 10 and/or 40, is increased, the pressure from the gas line 18, is also proportionally increased and kept at par with the external pressure being applied by the lamination platens 10 and/or 40. For most applications, using ceramics, it is preferred that the pressure differential between the first platen and the second platen or the two platens should be under about 700 psi, and more preferably between about 100 psi and about 200 psi.

Similarly, during the ramp down from the high platen pressure, the pressure of the gas has to be decreased simultaneously and proportionally, following the pressure-time path selected for the platen pressure.

At all times it is advantageous to maintain the pressure of the gas, lower than the pressure applied by the lamination platens 10 and/or 40, in order to minimize gas leakage through the platen-polymer sheet interface. Typical fluids that are used to apply the internal pressure to the cavities 27 and/or 37, during the lamination process include, but are not limited to dry air, nitrogen. Typically, the fluid is a gas, which is preferably selected from a group comprising air, helium, nitrogen, oxygen or any inert gas, to name a few.

The ceramic substrate 25, normally should have a sheet 17, of a non-sticky material 17, to help in the separation of the laminated ceramic substrate 25, from the first lamination plate 16. Similarly, the material for the cavity forming membrane 23 or 63, should also be some non-sticky material so that it does not stick either to the surface of the ceramic module 25, or to any other fixture or item that it comes in contact with. The non-sticky material for 17 or 23 or 63, could be the same or it could be different. The preferred non-sticky material could be a polymer sheet material 17 or 23 or 63, that will have minimal or no affinity for the ceramic and metallurgical materials used to build the ceramic module 25. This material of course should also help in separating the polymer layer 17 or 23 or 63, from the ceramic module 25, once the lamination process has completed. In some cases, the polymer or the membrane layer 23 or 63, should also be able to elongate easily under the lamination conditions so as to conform to the shape of the cavity 27.

Some examples of non-sticky material suitable for the process described here are: polymers, such as, Mylar if rigidity and low elongation is required, or latex rubber, polyethylene, etc., for high elongation cases. However, the at least one non-sticky material could be selected from a group comprising polymer, elastomer, Mylar (polyethylene terephthalate), latex rubber, polyethylene, to name a few.

In those cases where the non-sticky material or polymer is not required to elongate, a small hole should be provided in the polymer sheet in such a way that the hole will lay over the area of ceramic module where a cavity will be formed.

The required hole does not need to extend to the edge of the cavity, and does not need to exceed, for example, 1 mm in diameter if the cavity is larger than, for example, 2 mm in diameter.

This invention also allows a uniaxial press to be easily and economically converted into an isostatic press. Referring to FIGS. 1–3, when the platens or pressure devices 10 and 40, are closed, the products 25, and porous plates 51, are within the porous side walls 52, of the frame 12. Here isostatic lamination can now be exercised with high pressure gas distributed inside via the porous bodies 51 and 52.

It is preferred that the porous plates 51 and 52, have a porosity of between about 8 percent to about 50 percent, and preferably about 15 percent, as this would allow a good passage for the fluid that is being used to apply counter pressure while laminating the green sheets 24 and 26, forming the module 25.

In comparison to conventional multilayer ceramic module lamination, the process of this invention requires the addition of the high gas pressure distribution to the proper location and adequate gas pressure control to fabricate the desired cavities within the ceramic module while maintaining the same lamination conditions such as pressure and temperature and simultaneously maintaining the same lamination planarity of the final laminated structure.

EXAMPLES

The following examples are intended to further illustrate the invention and are not intended to limit the scope of the invention in any manner.

Example 1

Several samples of multilayer ceramic bodies containing cavities were fabricated using the process of this invention. In one sample a stack of cavity containing blank ceramic layers were placed in a lamination frame with porous side wall (porosity about 15%) as shown in FIG. 2, and the ceramic layers were separated from the lamination platens by a layer of Mylar. The Mylar layer was perforated with 1 mm holes wherever there was a cavity to be fabricated. A stainless steel porous plate with about 15% connected porosity was then placed over the cavity side of the mylar. This assembly was then preheated at a low pressure with the lamination platens sandwiching the assembly. The platens pressure was then increased while simultaneously gas pressure was also increased. At all times the pressure differential between the platens and the gas was kept under 300 psi. After the MLC had been laminated the ceramic body was then inspected and it was found that both the cavity and the ceramic body had good dimensional control.

Example 2

In another sample an assembly of ceramic layers were stacked and laminated in a manner described in Example 1, but the gas pressure was not increased from the ambient pressure. This sample produced gross deformation within the cavity area as expected, thus demonstrating the need for the process of this invention.

Example 3

In other sample an assembly of metallized multilayer ceramic layers containing a multi-step cavity design and the individual ceramic layers were stacked and placed in the lamination frame with porous side wall. This time, an unperforated elastomer was placed between the porous lamination plate and the ceramic surface which contained the ceramic cavity. This time the procedure as discussed in Example 1, was followed, but the gas pressure was kept at all times at 200 psi or less than the pressure applied by the lamination plate. After the MLC had been laminated the MLC having the cavity was inspected. It was found that the laminated structure and the multi-step cavity dimensions were within the desired specifications.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An apparatus for forming cavities in at least one ceramic layer comprising, a first plate to accommodate said at least one ceramic layer having at least one cavity, at least one cavity forming membrane over at least a portion of said at least one cavity in said at least one ceramic layer, at least one internal pressure means over said at least one membrane, a first porous plate having fluid passage means adjacent at least a portion of said at least one internal pressure means, and at least one external pressure application means adjacent said first porous plate, whereupon the application of said external pressure, said internal pressure means in cooperation with said at least one membrane counters said external pressure, and thereby forms said at least one ceramic layer having at least on cavity.

2. The apparatus of claim 1, wherein a plurality of ceramic layers are placed between said first plate and said first porous plate.

3. The apparatus of claim 1, wherein the material for said at least one ceramic layer is selected from a group consisting of alumina, alumina with glass frits, aluminum nitride, borosilicate and glass ceramic.

4. The apparatus of claim 1, wherein pressure differential between said first plate and said first porous plate is under about 700 psi, and more preferably between about 100 psi and about 200 psi.

5. The apparatus of claim 1, wherein at least one non-sticky material is placed between said first plate and said at least one ceramic layer.

6. The apparatus of claim 5, wherein said at least one non-sticky material is selected from a group consisting of polymer, elastomer, polyethylene terephthalate, latex rubber, and polyethylene.

7. The apparatus of claim 1, wherein said first plate, said at least one ceramic layer and said first porous plate are inside a frame.

8. The apparatus of claim 1, wherein said at least one membrane follows the contours of said at least one cavity in said at least one ceramic layer.

9. The apparatus of claim 1, wherein said pressure on said first porous plate is a hydraulic pressure and wherein said pressure in said at least one cavity is from a fluid.

10. The apparatus of claim 9, wherein said fluid is a gas selected from a group consisting of air, helium, nitrogen, oxygen and inert gas.

11. The apparatus of claim 1, wherein said ceramic substrate is pre-heated prior to the application of said pressure.

12. The apparatus of claim 1, wherein said at least one cavity forming membrane is pre-formed to the shape of said at least one cavity.

13. The apparatus of claim 1, wherein said first porous plate has a porosity of between about 8 percent to about 50 percent, and preferably about 15 percent.

14. An apparatus for forming cavities in at least one ceramic layer comprising, a first plate to accommodate said at least one ceramic layer having at least one cavity, at least one cavity forming membrane having at least one opening over at least a portion of said at least one cavity in said at least one ceramic layer, such that at least a portion of said at least one opening is over at least a portion of said cavity, at least one internal pressure means over said at least one membrane, a first porous plate having fluid passage means adjacent said internal pressure means and at least a portion of said at least one membrane, such that at least a portion of said at least one opening is over at least a portion of said opening in said membrane, and at least one external pressure application means adjacent said first porous plate, whereupon the application of said at least one external pressure said internal pressure means in cooperation with said at least one membrane counters said external pressure and thereby forms said at least one ceramic layer having at least on cavity.

15. The apparatus of claim 14, wherein a plurality of ceramic layers are placed between said first plate and said first porous plate.

16. The apparatus of claim 14, wherein the material for said at least one ceramic layer is selected from a group consisting of alumina, alumina with glass frits, aluminum nitride, borosilicate and glass ceramic.

17. The apparatus of claim 14, wherein pressure differential between said first plate and said first porous plate is under about 700 psi, and more preferably between about 100 psi and about 200 psi.

18. The apparatus of claim 14, wherein at least one non-sticky material is placed between said first plate and said at least one ceramic layer.

19. The apparatus of claim 18, wherein said at least one non-sticky material is selected from a group consisting of polymer, elastomer, polyethylene terephthalate, latex rubber, and polyethylene.

20. The apparatus of claim 14, wherein said first plate, said at least one ceramic layer and said first porous plate are inside a frame.

21. The apparatus of claim 14, wherein said pressure on said first porous plate is a hydraulic pressure and wherein said pressure in said at least one cavity is from a fluid.

22. The apparatus of claim 21, wherein said fluid is a gas selected from a group consisting of air, helium, nitrogen, oxygen and inert gas.

23. The apparatus of claim 14, wherein said ceramic substrate is pre-heated prior to the application of said pressure.

24. The apparatus of claim 14, wherein said first porous plate has a porosity of between about 8 percent to about 50 percent, and preferably about 15 percent.

* * * * *